United States Patent [19]
Moeller

[11] Patent Number: 5,928,022
[45] Date of Patent: Jul. 27, 1999

[54] MECHANICALLY-ASSITED CLIP DEVICE FOR USE IN TESTING ELECTRICAL EQUIPMENT

[75] Inventor: Ralf Moeller, Athens, Ga.

[73] Assignee: Reliance Electric Industrial Company, Cleveland, Ohio

[21] Appl. No.: 08/959,565

[22] Filed: Oct. 28, 1997

[51] Int. Cl.⁶ .................................................. H01R 4/60
[52] U.S. Cl. .......................................... 439/197; 439/822
[58] Field of Search .................................... 439/822, 829, 439/481, 759, 506, 197, 891, 169, 219, 482; 324/757

[56] References Cited

U.S. PATENT DOCUMENTS 2,846,658  8/1958  Bender ..................................... 439/891

*Primary Examiner*—Neil Abrams
*Assistant Examiner*—Michael C. Zarroli
*Attorney, Agent, or Firm*—Craig N. Killen; John M. Miller; John J. Horn

[57] ABSTRACT

A clip assembly used in testing electrical equipment includes a mechanical actuator to provide mechanically assisted clipping of electrical leads in a manufacturing environment. In a preferred embodiment, the actuator takes the form of a fluid-actuated cylinder such as a pneumatic cylinder. The clip assembly includes a spring to urge the test clip into a clamping position. Upon activation, pressurized fluid is directed to the cylinder, causing a force to oppose the spring and move the test clip into a release position.

23 Claims, 3 Drawing Sheets

MECHANICALLY-ASSISTED CLIP DEVICE FOR USE IN TESTING ELECTRICAL EQUIPMENT

BACKGROUND OF THE INVENTION

The present invention relates to an improved clip device for testing electrical equipment. More particularly, the invention relates to a mechanically-assisted test clip to facilitate connection of lead wires to electrical testing devices.

Electrical test clips are frequently utilized in manufacturing plants to connect electrical leads of the manufactured products to various testing devices. In particular, products such as electromechanical machines must be tested to verify the internal workings of the product. Toward this end, the leads are typically connected to testing devices that measure electrical continuity and the like while at the same time supplying power to the equipment to be tested. Test clips allow this connection to be rapidly made by the plant worker.

Conventional test clips clamp the electrical leads utilizing spring-biased clamping jaws made from an electrically conductive metal. The jaws must be opened by hand in order to effect connection or disconnection of the test clip to the electrical lead. In one common clip, an average force of about forty-eight pounds must be manually applied to the clip to open the clamping jaws.

A test clip which relies on manual force for its operation may cause significant hand strain for a manufacturing worker operating the device repeatedly throughout the workday. In addition, many manufactured products have multiple leads that must be connected to the testing device at one time. Thus, a worker may be required to connect a number of test clips for each unit to be tested. Thus, the use of manually operated clips can significantly slow the progress of product testing. It will be appreciated that a reduction in the manual force requirement would be considered advantageous.

SUMMARY OF THE INVENTION

The present invention recognizes and addresses the foregoing disadvantages, and others, of prior art construction and methods.

Accordingly, it is an object of the present invention to provide an improved design for an electrical test clip.

It is also an object of the present invention to eliminate the need for substantial manual force to attach the clip to electrical leads for testing purposes.

It is a still further object of the present invention to improve efficiency of testing by providing a test clip which may be attached uniformly and quickly to electrical leads.

Some of the these objects are achieved by a mechanically-assisted clip assembly having a conductive clamping mechanism, movable between a clamping position and a release position, surrounded by an insulative shroud. A mechanical actuator applies a moving force to the clamping mechanism to adjust it between the clamping position and the release position.

In many embodiments, the mechanical actuator comprises a fluid-actuated cylinder. In such embodiments, a valve is preferably mounted on the clip assembly to selectively direct actuating fluid to the cylinder. The valve may be controlled by a lever, or other suitable control mechanism.

The clip assembly may have a biasing element, such as a spring, configured to urge the clamping mechanism into either the clamping position or the release position. Introduction of fluid into the cylinder causes the clamping mechanism to move against the biasing force from its at-rest position.

The clamping mechanism may be configured having a pair of arm members pivotally movable with respect to one another. The arm members include a forward clamping portion that operates to engage the electrical lead. The clamping portion may include opposing bite portions attached to the arm members. In addition, the arm members may cross at a midpoint location between the pivot point and the forward clamping portion, thereby defining a space into which the biasing element may be mounted. The connected arm members and the biasing element are preferably surrounded by the insulative shroud.

The accompanying drawings, which are incorporated in and constitute a part of this specification, illustrate one embodiment of the invention and, together with the description, serve to explain the principles of the invention.

BRIEF DESCRIPTION OF THE DRAWINGS

A full and enabling disclosure of the present invention, including the best mode thereof and directed to one of ordinary skill in the art, is set forth in the specification, which makes reference to the appended drawings, in which.

Figure 1:
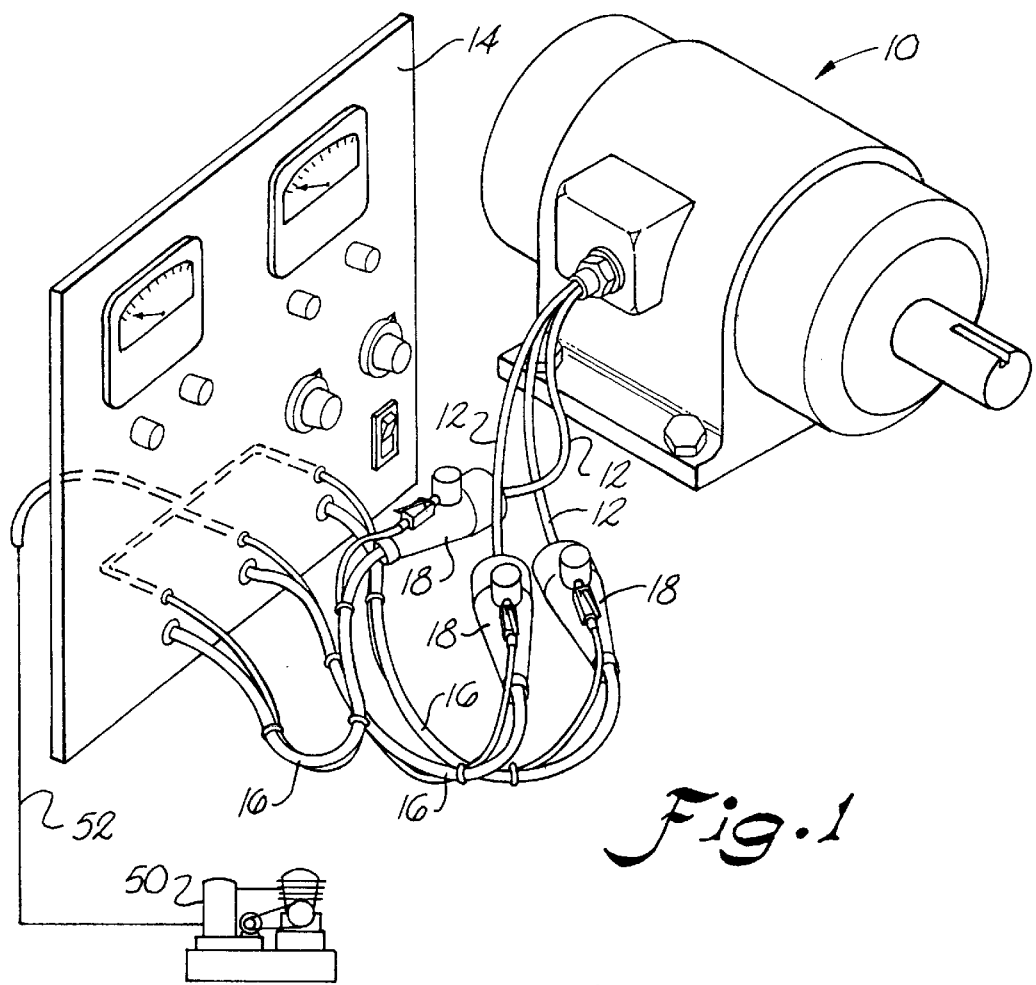
FIG. 1 is a perspective view showing a plurality of mechanically-assisted test clips constructed in accordance with the present invention in use to test an electric motor.

Repeat use of reference characters in the present specification and drawings is intended to represent same or analogous features or elements of the invention.

DETAILED DESCRIPTION OF THE PREFERRED EMBODIMENTS

Reference will now be made in detail to the presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For example, features illustrated or described as part of one embodiment may be used in another embodiment to yield a still further embodiment.

FIG. 1 illustrates a typical situation in which a test clip assembly of the present invention could be advantageously employed. An electric motor 10 includes a plurality of electrical leads 12 to be tested utilizing testing equipment generally indicated at 14. Because motor 10 is in this case a three-phase AC motor, at least three such leads 12 are provided. Each of the leads 12 is connected to a corresponding test lead 16 utilizing a respective test clip 18.

Other than the improvements described herein, test clips 18 are similar to test clips of the prior art. Unlike the prior art, test clips 18 are mechanically assisted to facilitate connection with electrical leads 12. As such, most of the force otherwise required for attaching the test clip to the electrical lead is provided by a mechanical actuator. In fact, the only force that must generally be applied is that required to activate the mechanical actuator device itself. For example, a prior art Mueller CX-33C clip having a spring-biased clamping and a Mueller CX-35-0 insulative shroud may be modified to include a mechanical actuator as described herein.

Figure 2A:
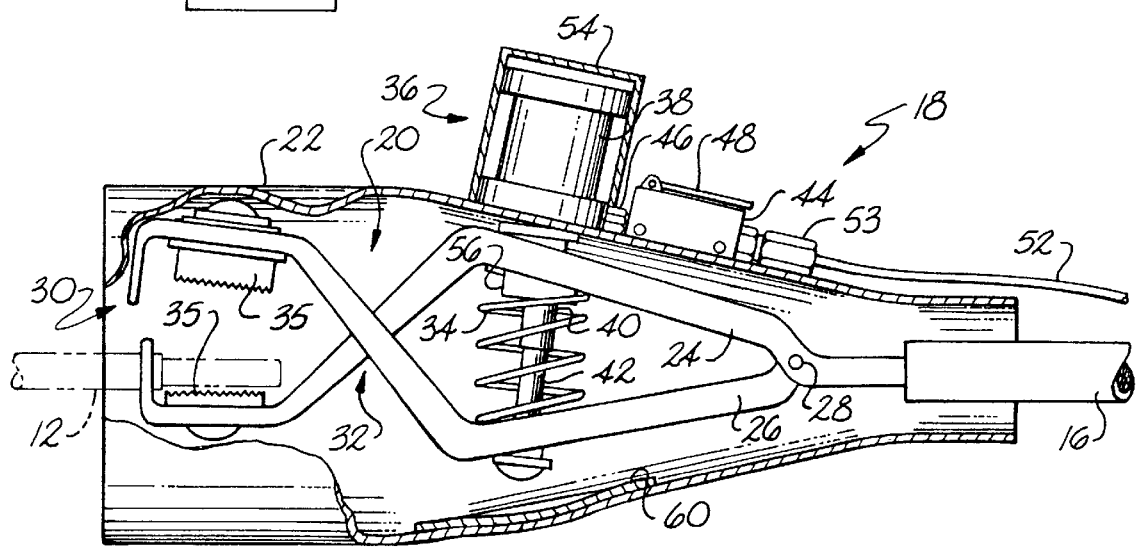
FIGS. 2A and 2B are cut-away elevational views of a single mechanically-assisted test clip as is shown in FIG. 1 in a release position and a clamping position, respectively.
Figure 2B:
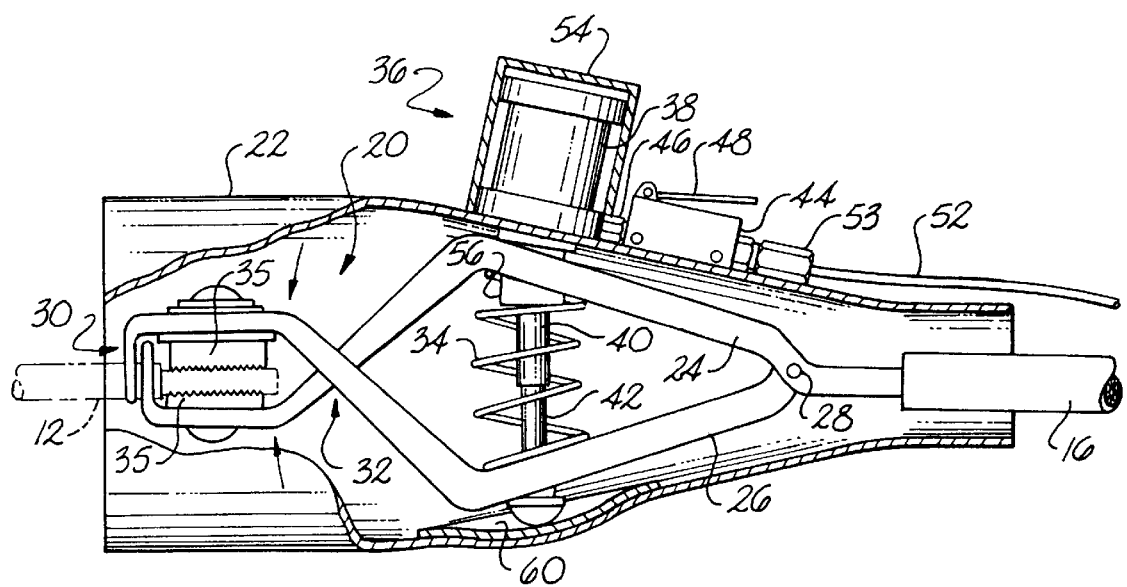
Figure 3:
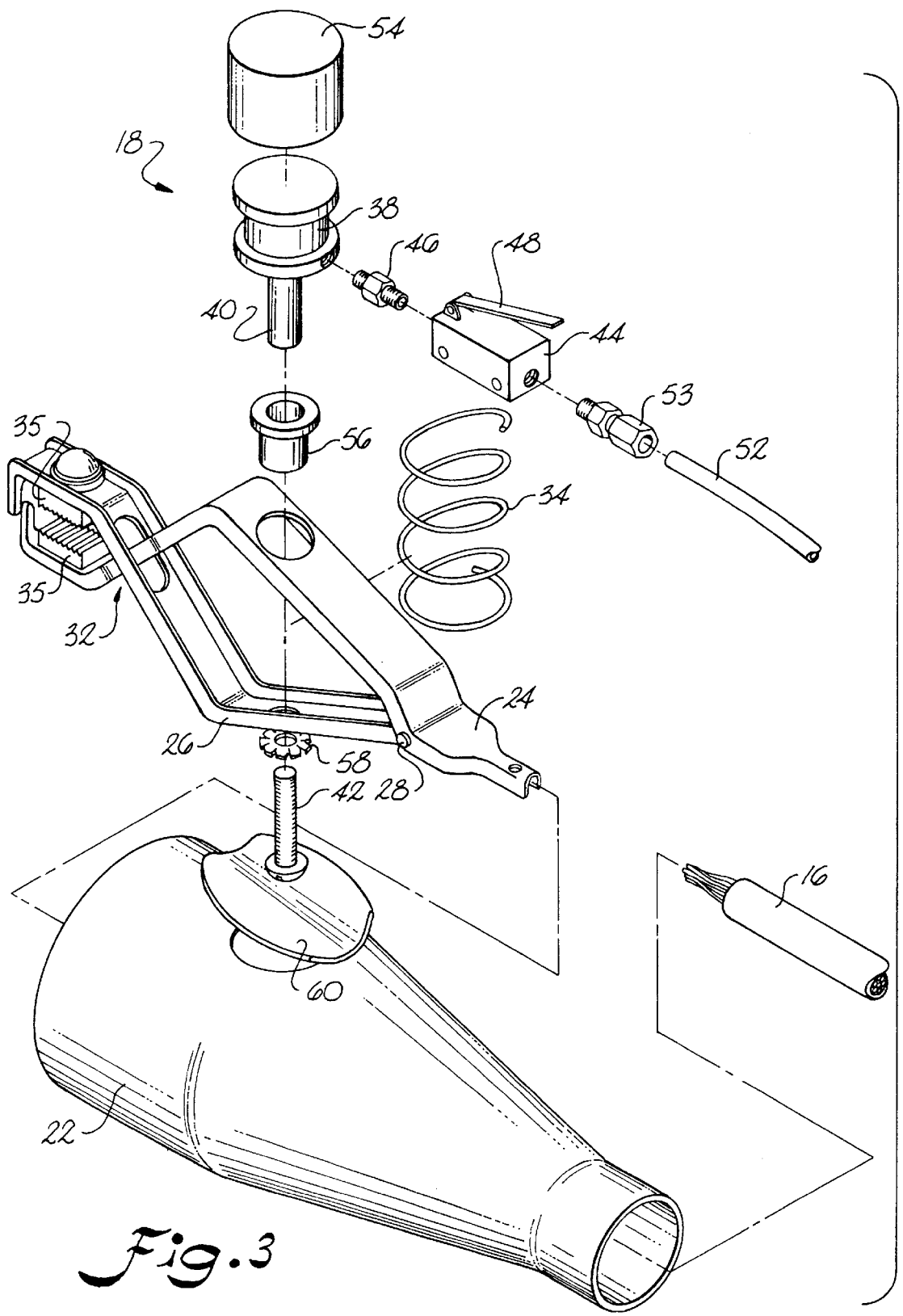
FIG. 3 is an assembly view of the mechanically assisted test clip of FIGS. 2A and 2B.

Referring now to FIGS. 2A, 2B and 3, a preferred construction of test clip 18 will be explained. Clip 18 has a electrically conductive clamping mechanism, generally indicated at 20, surrounded by an insulative shroud 22. Clamping mechanism 20 is movable into an open release position whereby it is disengaged from electrical lead 12. When electrical lead 12 is positioned in the clamping jaws, it may be engaged by movement of clamping mechanism 20 into the closed clamping position.

In the illustrated embodiment, clamping mechanism 20 is formed by a pair of arm members 24 and 26 connected together at a pivot point 28. As can be seen, arm member 24 extends back beyond pivot point 28 for electrical connection to test lead 16. Forward of pivot point 28, arm members 24 and 26 define a clamping portion 30 adapted to engage lead 12.

In this case, arm members 24 and 26 cross at a midpoint location 32 to define a space between there and pivot point 28. A coil spring 34 is located in this space to urge arm members 24 and 26 apart. As a result, clamping portion 30 will normally be brought into the clamping position, as shown in FIG. 2B. Preferably, clamping portion 30 will be equipped with opposed bite portions 35 made of a suitable conductive material.

As shown in FIG. 2A, electrical lead 12 is released when arm members 24 and 26 are compressed together against the force of spring 34. As described above, this compressive force has been applied manually by the worker in prior art test clip arrangements. In contrast, test clip 18 is equipped with a mechanical actuator 36 to supply this compressive force without significant effort by the worker. One preferred embodiment of the invention requires a manual actuating force of only about 1.5 pounds in comparison with the 48 pounds of manual force required with a comparable prior art device.

In this case, the mechanical actuator comprises a pneumatic piston/cylinder assembly 38 positioned outside of insulative shroud 22. A piston rod 40, having a nonconductive screw 42 threaded into the distal end thereof, extends from assembly 38. Piston rod 40 thus forms a linkage operatively connecting assembly 38 with arm members 24 and 26.

A valve 44 is provided in fluid communication with piston/cylinder assembly 38 via an interposing fitting 46. Valve 44 is preferably a three-way valve controlling flow of pressurized air to and from the cylinder. In particular, operation of valve 44 permits pressurized air to be introduced into the cylinder, exhausted from the cylinder, or held, as desired. Valve 44 is itself controlled by the user via an actuating lever 48. The pressurized air is provided by an air source 50 (FIG. 1) in fluid communication with valve 44 via a fluid supply line 52. A suitable fitting 53 may be provided to interconnect line 52 with valve 44 as shown.

Means are also preferably provided to electrically insulate the various components of mechanical actuator 36. For example, assembly 38 preferably includes its own insulative cover 54 to provide electrical isolation. In addition, insulative bushing 56 is situated about piston rod 40 to insulate it from arm member 24. As noted above, screw 42 is nonconductive (typically plastic). A suitable washer 58 may be provided between the head of screw 42 and arm member 26, as shown. An insulative shield 60 is also positioned under the head of bolt 42 to lessen wear on shroud 22 that could otherwise occur at this location.

It can thus be seen that the present invention provides a mechanically-assisted test clip that reduces the manual force requirement of prior art clips. While preferred embodiments of the present invention have been described above, it is to be understood that any and all equivalent realizations of the present invention are included within the scope and spirit thereof. Thus, the embodiments depicted are presented by way of example only and are not intended as limitations upon the present invention. While particular embodiments of the invention have been described and shown, it will be understood by those of ordinary skill in the art that the present invention is not limited thereto since many modifications can be made. Therefore, it is contemplated that any and all such embodiments are included in the present invention as may fall within the literal or equivalent scope of the appended claims.

What is claimed is:

1. A mechanically assisted clip assembly, comprising:
   pivotally connected arm members including a forward clamping portion movable between a clamping position and a release position;
   a biasing element disposed between said arm members to urge said arm members into said clamping position; and
   a mechanical actuator device operative to apply a force to at least one of said arm members sufficient to overcome said biasing element and position said arm members in said release position.

2. A clip assembly as set forth in claim 1, wherein at least one of said arm members is electrically conductive.

3. A clip assembly as set forth in claim 2, further comprising a conductive wire electrically connected to said at least one of said arm members.

4. A clip assembly as set forth in claim 2, further comprising an insulative shroud surrounding said arm members.

5. A clip assembly as set forth in claim 1, wherein said mechanical actuator comprises a fluid-actuated cylinder mechanism.

6. A clip assembly as set forth in claim 5, further comprising a valve device in fluid communication with said fluid-actuated cylinder mechanism.

7. A clip assembly as set forth in claim 6, further comprising a fluid supply source in fluid communication with said fluid-actuated cylinder mechanism.

8. A clip assembly as set forth in claim 5, wherein said biasing element urges said arm members away from each other, said fluid-actuated cylinder mechanism including a piston rod linkage operatively connected to move said arm members together.

9. A mechanically assisted clip assembly, comprising:
   an electrically conductive clamping mechanism movable between a clamping position and a release position;
   an insulative shroud situated about said clamping mechanism; and
   a mechanical actuator disposed outside of said shroud member and operatively connected to apply a moving force to said clamping mechanism such that said clamping mechanism is adjusted to at least one of said clamping position and said release position.

10. A clip assembly as set forth in claim 9, further comprising a biasing element operatively connected to said clamping mechanism, said mechanical actuator movable against a force of said biasing element.

11. A clip assembly as set forth in claim 10, wherein said biasing element urges said clamping mechanism to said clamping position and said mechanical actuator operatively moves said clamping mechanism to said release position upon actuation thereof.

12. A clip assembly as set forth in claim 11, wherein said mechanical actuator is a fluid-actuated cylinder mechanism.

13. A clip assembly as set forth in claim 9, wherein said mechanical actuator is electrically isolated from said clamping mechanism.

14. A mechanically assisted clip assembly, comprising:
- a pair of electrically conductive arm members pivotally connected to one another, said arm members defining a clamping portion movable between a clamping position and a release position;
- an insulative shroud surrounding said arm members;
- a biasing element positioned to urge said arm members into one of said clamping position and said release position; and
- a mechanical actuator operatively connected to said arm members and operative to overcome said biasing element to position said arm members into another of said clamping position and said release position.

15. A clip assembly as set forth in claim 14, wherein said mechanical actuator comprises a fluid-actuated cylinder mechanism.

16. A clip assembly as set forth in claim 15, wherein said cylinder mechanism includes a piston rod linkage connected to said arm members in a manner to be electrically insulated therefrom.

17. A clip assembly as set forth in claim 16, wherein said piston rod linkage comprises a nonconductive screw threaded axially into a metallic piston rod of said cylinder mechanism.

18. A clip assembly as set forth in claim 17, comprising at least one insulative member situated between said piston rod linkage and one of said pair of arm members.

19. A clip assembly as set forth in claim 15, wherein said fluid-actuated cylinder mechanism is a pneumatic cylinder mechanism.

20. A clip assembly as set forth in claim 19, further comprising a pneumatic valve disposed outside of said insulative shroud, said pneumatic valve being in fluid communication with said pneumatic cylinder mechanism to selectively direct pressurized air thereto.

21. A clip assembly as set forth in claim 14, wherein said arm members define a forward end and a back end, said arm members pivotally connected at said back end with said clamping portion disposed at said forward end, said biasing element disposed within a space defined within said arm members between said forward and back ends.

22. A clip assembly as set forth in claim 21, wherein said arm members are crossed at a midpoint location between said forward end and said back end, said space being defined between said midpoint location and said back end, said biasing element thereby biasing said arm members to said clamping position.

23. A clip assembly as set forth in claim 21, wherein said clamping portion includes opposing bite portions.

* * * * *